Aug. 26, 1969 O. O. ALDERMAN 3,464,032

MULTIPLE FREQUENCY TUNING FORK FILTER

Filed March 28, 1967

INVENTOR
ORBA O. ALDERMAN

BY Horowitz, Rau & Greene

ATTORNEYS 3,464,032
Patented Aug. 26, 1969

3,464,032

MULTIPLE FREQUENCY TUNING FORK FILTER

Orba O. Alderman, Alexandria, Va., assignor to Melpar, Inc., Falls Church, Va., a corporation of Delaware Filed Mar. 28, 1967, Ser. No. 626,619
Int. Cl. H01p *5/12*
U.S. Cl. 333—6 7 Claims

ABSTRACT OF THE DISCLOSURE

An electromechanical filter having a tuning fork with associated drive and pickup coils. One or both tines of the tuning fork is provided with subsidiary tuning forks for narrow band response to a plurality of driving frequencies equal in number to the number of tuning forks present.

BACKGROUND OF THE INVENTION

The present invention relates generally to wave filters of the electromechanical transducer type, capable of discriminating two or more separated frequencies, and in particular to a tuning fork filter wherein independent smaller tuning forks are formed on one or both tines of the main tuning fork to provide two or more resonant frequency selection capabilities in a single unit.

In the past, where the filtering of a plurality of different (separated) frequencies has been required or desired, it has frequently been necessary to provide one filter for each particular resonant frequency to be passed. In a typical arrangement the electromechanical filters utilize reeds to resonate at the selected frequencies. If the reeds are characterized by relatively wide bandwidth, the resonant frequencies must be spaced several tens of cycles per second apart to insure reliable discrimination. Irrespective of the particular electromechanical transducer employed in the wave filter, the requirement of a plurality of filters quite obviously means a duplication of internal parts.

Certain prior art wave filters have been proposed, however, in which a plurality of vibratory reeds are employed in a single unit as the frequency sensitive elements of a multiple frequency filter. In particular, some frequency meters utilize a bank of vibratory reeds, with each reed carefully constructed to provide discrimination of a distinct and different narrow band of frequencies of electromagnetic waves coupled thereto. Problems have arisen, however, in respect to efficiency of electromagnetic coupling, sensitivity to temperature variations, size of package, and so forth. More recent proposals for multiple frequency electromechanical filters have suggested coupling piezoelectric devices to the vibratory reed elements. While this permits a convenient electrical signal output, as opposed to the usual mechanical output coupling in the case of the above-mentioned frequency meter, there are nevertheless disadvantages such as added complexity in mechanical structure and in electrical output connections.

SUMMARY OF THE INVENTION

It is a primary object of the present invention to provide a multiple frequency electromechanical filter in which the electromechanical transducer comprises a tuning fork assembly.

Briefly, in accordance with the present invention a multiple frequency electromechanical wave filter is provided in which there is utilized a main tuning fork and associated drive and pickup coils in a relatively conventional arrangement, but wherein the main tuning fork includes one or more subsidiary tuning forks each constructed to resonate at a different frequency from that at which each of the other forks, including the main fork, resonates. To this end, one or both tines of the main fork supports and/or includes an independently operated smaller tuning fork arranged and adapted to vibrate in the tuning fork mode (as opposed to the reed mode) at a higher frequency than that at which the main fork vibrates. If each tine of the main fork includes a separate smaller fork, these latter forks are constructed to resonate at different frequencies. That is, the overall geometry of the main fork and its subsidiary units is non-symmetrical, although it will be understood that the main fork and each attached fork is structurally balanced insofar as its own tine and connecting structure are concerned. This is necessary to insure that the tines of any given fork vibrate in unison, alternately toward and away from each other, and with the same amplitude of vibrations. Accordingly, each fork passes its resonant frequency (and a narrow band containing that frequency, if desired), when actuated by the drive coil, to a pickup coil, the overall unit operating as an electromechanical filter capable of discriminating and passing the several selected resonant frequencies while rejecting all others. The bandwidth of each tuning fork is narrow, thereby permitting closely spaced resonant frequencies, and hence, more resonances over a given frequency band.

It is therefore a more specific object of the present invention to provide a multiple frequency electromechanical wave filter employing one or more subsidiary tuning forks supported by a main tuning fork in a geometrically non-symmetrical array capable of passing two or more separated frequencies.

BRIEF DESCRIPTION OF THE DRAWINGS

The above and still further objects, features and attendant advantages of the present invention will become apparent from a consideration of the following detailed description of preferred exemplary embodiments thereof, especially when taken in conjunction with the accompanying drawings, in which.

DESCRIPTION OF THE PREFERRED EMBODIMENTS

Figure 1:
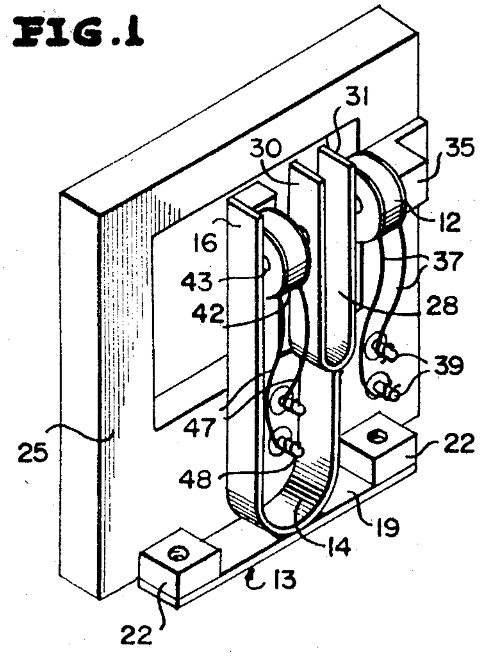
FIGURE 1 is a perspective view of one embodiment of a multiple frequency tuning fork filter according to the invention.
Figure 2:
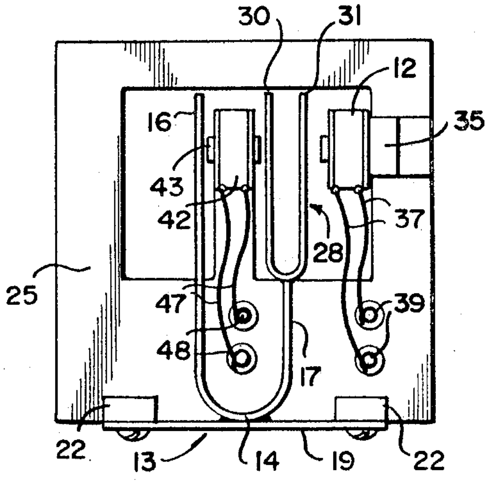
FIGURE 2 is a front view of the tuning fork of FIGURE 1.
Figure 3:
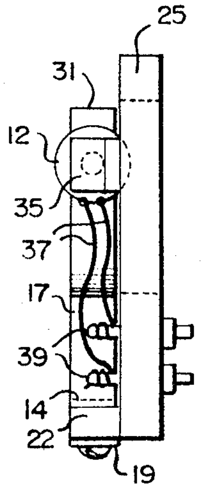
FIGURE 3 is a side view of the tuning fork of FIGURE 1.

Referring now to FIGURES 1–3, a source of variable frequency signal, not shown, supplies a drive coil 12 of a tuning fork filter assembly 13. Assembly 13 includes a main tuning fork 14 having a pair of vibratile tines 16 and 17 preferably connected in a U-shaped configuration of sheet metal. A suitable material for tuning fork 14 as well as the tuning fork components which will subsequently be discussed is Ni-Span-C.

The bridging portion of fork 14 is secured in any convenient and conventional manner to a base element or strip 19, which is in turn fastened, as by screws, to the feet 22 of metal block 25. A shielding cover, not shown, of Mumetal for example, may slide over block 25 to house the entire assembly.

According to the embodiment of the present invention now under consideration, tuning fork 14 includes on tine 17 a smaller independent tuning fork 28, also fabricated of U-shaped sheet metal and attached along the portion bridging its tines 30, 31 to tine 17 of the main fork. The thickness or width of the sheet forming subsidiary fork 28 is less than that of main tuning fork 14 and the construction is such that the center of mass of each of tines 16 and 17 (the latter including fork 28) is identically located along the respective tine. That is to say, while the geometric configuration of the tuning fork assembly is non-symmetrical, each tuning fork is structurally balanced to insure proper vibrational operation. In the embodiment of FIGURES 1–3, fork 28 being smaller than main fork 14 resonates at a frequency higher than that of fork 14, and these resonant frequencies may be selected in conventional manner using known methods of tuning fork costruction.

Figure 4:
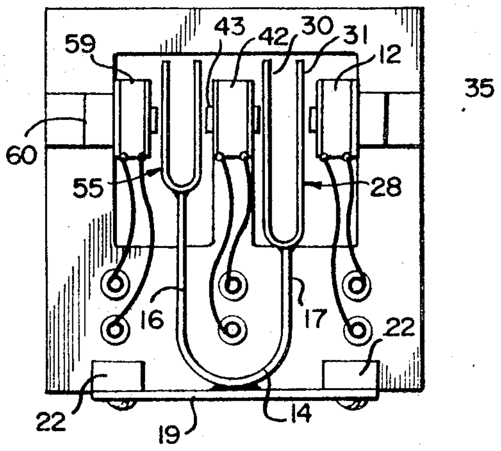
FIGURE 4 is another embodiment of a multiple frequency tuning fork filter according to the invention.

The drive coil 12 for tuning fork assembly 13 includes a magnetic core 35 attached in any convenient and conventional manner to metal block 25, to provide support for the core-magnet combination. Preferably, the drive coil is disposed with its axis perpendicular to the axis of the main fork, and is outside the tine supporting the subsidiary fork. If both tines are provided with additional forks, the drive coil and magnet may be positioned outside either tine of the main fork with respect to the axis thereof, or two drive coil-magnet combinations may be employed, as shown in FIGURE 4.

Drive coil 12 is connected to the source of variable input signal by end leads 37, coupled to posts 39 and thence to input terminals at the rear of the unit.

A pickup coil 42 and magnetic core 43 are axially aligned along the axis of the drive coil, but preferably within the space defined by the two tines of the main tuning fork. Again, the pickup coil is connected to output terminals (not shown) at the rear of the unit via leads 47 to binding posts 48.

In operation of the embodiment of FIGURES 1–3, let it be assumed, for example, that the main fork 14 resonates at a frequency of 450 c.p.s. and subsidiary fork 28 at a frequency of 1050 c.p.s. In such an instance, if the drive coil is driven by a frequency of 450 c.p.s., the entire fork assembly 13 oscillates and an AC voltage of 450 c.p.s. is induced into the pickup coil. Application of a signal of 1050 c.p.s. frequency to drive coil 12 on the other hand produces substantial oscillation of only tuning fork 28, which in turn induces an AC voltage at 1050 c.p.s. into pickup coil 42. In this respect it will be understood that some vibration of tine 17 accompanies vibration of fork 28, and vice versa, but I have found these secondary vibrations to be negligible in effect on the output of the filter.

Frequencies other than the resonant frequencies of the tuning forks, or outside the narrow bandwidth of each fork, are of course rejected.

In FIGURE 4, there is shown the front view of an embodiment of the electromechanical filter according to my invention in which each tine 16, 17 of the main tuning fork includes a subsidiary tuning fork 55, 28, respectively. A second drive coil 59, with associated magnetic core 60, is disposed outside tine 16 and driven in parallel with drive coil 12. Otherwise, the configuration of the embodiment of FIGURE 4 is the same as that of FIGURES 1–3. In operation, the tuning fork filter of FIGURE 4 is responsive to three discrete frequencies, corresponding to the resonant frequencies of the three forks, and rejects all others. It will again be observed, in this respect, that the tuning fork assembly lacks geometrical symmetry; hence, each portion of the assembly responds to a distinct and different frequency.

The use of subsidiary tuning forks may be carried further, if desired. For example, one or both of tines 30 and 31 of fork 28 may support another smaller tuning fork, and so forth. Limitations are placed upon such an arrangement, of course, by the physical size of the final unit. The two and three fork embodiments which have been described provide multiple frequency electromechanical filters in extremely small packages.

While I have disclosed certain preferred embodiments of my invention, it will be apparent that variaitons of the specific details of construction which have been illustrated and described may be resorted to without departing from the spirit and scope of the invention.

I claim:

1. An electromechanical filter for transferring signal between a source of a load and a plurality of preselected separated frequencies within a predetermined band while substantially rejecting other frequencies within said band, said filter comprising a main tuning fork having a pair of vibratile tines, a subsidiary tuning fork carried by one tine of said main fork, a further subsidiary fork, carried by the other tine of said main fork, the overall assembly of forks being geometrically non-symmetrical, each of said main fork and the first-named and said further subsidiary forks having a resonant frequency distinct and different from the resonant frequencies of the other works and corresponding to a respective one of said preselected frequencies, electromagnetic drive means coupled to said source for resonating said main fork and said subsidiary forks at their respective resonant frequencies, and electromagnetic pickup means coupled to said load for response to vibration of said main fork and said subsidiary forks.

2. The filter according to claim 1 wherein each of said subsidiary tuning forks is resonant at a higher frequency than the resonant frequency of said main tuning fork.

3. The filter according to claim 1 wherein said electromagnetic drive means comprises a separate drive coil adjacent each subsidiary fork.

4. A tuning fork resonator, comprising:

first, second, and third tuning forks, each of U-shaped sheet metal construction in which the sheet metal is bent back on itself to form spaced normally parallel tines with a bridging portion constituting the bend between the tines, said first, second, and third forks being of successively smaller size in the order recited, a fixed base member, said first fork fastened at the center of its bridging portion to said base member to permit freedom of vibration of its tines, said second fork fastened at the center of its bridging portion to one tine of said first fork such that the tines of the second fork are offset from and normally parallel to said one tine of the first fork and are capable of vibration relative to said one tine, said third fork fastened at the center of its bridging portion to the other tine of the first fork such that the tines of the third fork are offset from and normally parallel to said other tine of the first fork and are capable of vibration relative to said other tine, drive means for subjecting each of said forks to vibration in the tuning fork mode at a distinct and different resonant frequency from the resonant frequency of each of the other forks, and pickup means for generating respective electrical signals in responsive to said vibration of each of said forks.

5. The tuning fork resonator of claim 4 wherein said one tine of the first fork and the second fork fastened thereto have a combined center of mass located equidistant from the center of the bridging portion of the first fork, to the distance from the combined center of mass of said other tine of the first fork and the third fork fastened thereto to the center of the last-named bridging portion.

6. The tuning fork resonator of claim 4 wherein said drive means comprises separate drive coils adjacent the respective outer tines of said second and third forks, and wherein said pickup means comprises a pickup coil between the respective inner tines of said second and third coils.

7. The tuning fork resonator of claim 6 wherein each of said drive coils and said pickup coil has a longitudinal axis normally perpendicular to the tines of said second and third forks.

References Cited

UNITED STATES PATENTS 3,361,994 1/1968 Takahashi ---------- 333—71

FOREIGN PATENTS 892,344 10/1953 Germany.

HERMAN KARL SAALBACH, Primary Examiner

T. VEZEAU, Assistant Examiner

U.S. Cl. X.R.

333—71